United States Patent
Mikhaltsevitch et al.

(10) Patent No.: US 7,250,763 B2
(45) Date of Patent: Jul. 31, 2007

(54) PROBE COIL FOR DETECTING NQR-RESPONSIVE MATERIALS IN LARGE VOLUMES

(75) Inventors: Vassili Timofeevitch Mikhaltsevitch, St. James (AU); Taras Nikolaevitch Rudakov, Willetton (AU); Warrick Paul Chisholm, Ferndale (AU); John Harold Flexman, Kardinya (AU); Peter Alaric Hayes, Wembly Downs (AU)

(73) Assignee: QRSciences Pty. Ltd., Cannington, WA (AU)

( * ) Notice: Subject to any disclaimer, the term of this patent is extended or adjusted under 35 U.S.C. 154(b) by 0 days.

(21) Appl. No.: 10/534,024

(22) PCT Filed: Nov. 6, 2003

(86) PCT No.: PCT/AU03/01470

§ 371 (c)(1),
(2), (4) Date: Dec. 5, 2005

(87) PCT Pub. No.: WO2004/042426

PCT Pub. Date: May 21, 2004

(65) Prior Publication Data

US 2006/0145697 A1     Jul. 6, 2006

(30) Foreign Application Priority Data

Nov. 6, 2002   (AU) .............................. 2002952486

(51) Int. Cl.
*G01V 3/00* (2006.01)

(52) U.S. Cl. ..................................................... 324/318
(58) Field of Classification Search ................ 324/318
See application file for complete search history.

(56) References Cited

U.S. PATENT DOCUMENTS

| 4,743,852 | A | * | 5/1988 | Ikeda .......................... 324/318 |
| 5,168,224 | A | | 12/1992 | Maruizumi et al. |
| 5,276,398 | A | | 1/1994 | Withers et al. ............. 324/318 |
| 5,457,385 | A | * | 10/1995 | Sydney et al. ............. 324/301 |
| 6,054,855 | A | * | 4/2000 | Anderson ................... 324/318 |
| 2003/0062896 | A1 | * | 4/2003 | Wong et al. ................ 324/318 |

OTHER PUBLICATIONS

S.S. Kim et al, "Experimental Investigations of the strong Off-Resonant Comb (SORC) Pulse Sequence in NQR", Z. Naturforsch, vol. 47a, 1992, pp. 415-420.

(Continued)

*Primary Examiner*—Brij Shrivastav
*Assistant Examiner*—Megann E Vaughn
(74) *Attorney, Agent, or Firm*—Michael Bednarek; Paul, Hastings, Janofsky & Walker LLP (57) ABSTRACT

A coil assembly (11) comprising two coil sections (13a and 13b). Each of the sections (13) consists of a combinat of a spiral coil (15) having a variable coil pitch arranged in a saddle shape configuration. The saddle shape has a central port (17) and a pair of outer coextending portions (19). The coil sections (13) are located opposite each other with the central p(17) of the respective sections disposed in parallel spaced apart relationship and the corresponding coextending portions (19) of respective sections disposed in coplanar alignment with each other so that the sections combine to circumscribe a scanned volume within which the target substance is to be disposed.

7 Claims, 7 Drawing Sheets

OTHER PUBLICATIONS

Rudakov, T.N. et al., "A System of Coils for Detecting Signals of Nuclear Quadrupole Resonance", Instruments and Experimental Techniques, vol. 41, 1998, pp. 398-400.

Hirschfeld, T. and Klainer, S.M., "Short Range Remote NQR Measurements", Journal of Molecular structure, vol. 58, 1980, pp. 63-77.

Rudakov, T.N. et al, "Improvement of the Uniformity of the RF Field Generated by the Helical Surface Coil of a Nuclear-Quadrupole Resonance Spectrometer", Instruments and Experimental Techniques, vol. 44, No. 1, 2001, pp. 81-83.

Hayes, C.E. et al, "Radio Frequency Resonators", Magnetic Resonance Imaging, ed by C. L. Partain, R.R. Price, J.A. Patton, M.V. Kulkarni, A.E. James, Saunders, 1988, pp. 1183-1200.

* cited by examiner

PROBE COIL FOR DETECTING NQR-RESPONSIVE MATERIALS IN LARGE VOLUMES

FIELD OF THE INVENTION

This invention refers to nuclear quadrupole resonance (NQR), and more specifically to detecting substances in large volumes using NQR techniques.

Within this document the term "substance" is taken to mean those materials, which respond to the NQR phenomenon. For a discussion of the NQR phenomenon, regard should be made to our co-pending International Patent Application PCT/AU00/01214, which is incorporated herein by reference.

Throughout the specification, unless the context requires otherwise, the word "comprise" or variations such as "comprises" or "comprising", will be understood to imply the inclusion of a stated integer or group of integers but not the exclusion of any other integer or group of integers.

BACKGROUND ART

The proceeding discussion of the background art is intended to facilitate an understanding of the present invention only. It should be appreciated that the discussion is not an acknowledgement or admission that any of the material referred to was part of the common general knowledge in Australia as at the priority date of the application.

The probe coil of a pulsed NQR detector having a radio frequency (RF) transmitter and an RF receiver is a device providing interaction between the radio frequency (RF) field of the RF transmitter and a target substance irradiated by the RF field, as well as between the RF field response from the target substance and the RF receiver of the NQR detector, pursuant to being irradiated by the RF field. This interaction is implemented as a rule by a coil that constitutes a part of the resonant circuit of the probe coil, which coil circumscribes a scanned volume that can be permeated by the RF field and which can receive an RF field responsive to a target substance irradiated by the RF field within the scanned volume.

The sensitivity of the NQR detector is determined to a large extent by the efficiency of this interaction, with the degree of homogeneity of the magnetic component of the RF field within the scanned volume being designated as its main characteristic. The homogeneity of the magnetic component of an RF field is mathematically described by the gradient of the function of the magnetic component.

The detection of substances in large volumes places special requirements on the sensitivity of the NQR detector and, consequently, on the homogeneity of the RF field inside the volume circumscribed by the coil.

For example, when searching for substances (such as explosives or narcotics) inside a package or luggage item, the amount of the substance to be detected will usually occupy a relatively insignificant volume, located somewhere within the item to be scanned. The natural requirement therefore is for the response from the substance to be independent of the position of the substance within the volume circumscribed by the coil.

When using a multi-pulse sequence, such as that described in our co-pending International Patent Application PCT/AU00/01214, the level of the registered signal depends on the average value of the amplitude of the magnetic component of the RF field within the period of the sequence, determined at the location of the sample as described in the paper by S S Kim, J R P Jayacody and R A Marino, "*Experimental investigations of the Strong Off-resonant Comb (SORC) pulse sequence in NQR*", Z Naturforsch. 47a 415–420 (1992). Therefore, the requirement stated above for the response of the substance to be independent of the position of the substance within the scanned volume is associated with the need for a homogeneous RF field in the total volume circumscribed by the coil.

To create a homogeneous RF field at the substance location, U.S. Pat. No. 5,168,224 (Maruizumi et al) suggests the use of a paired NQR detector coil arrangement consisting of two flat identical spirals placed in parallel spaced apart relationship on the same axis, with the target substance placed in the space between them. Such a coil arrangement was studied in detail within the article by Rudakov et al, "*A System of Coils for Detecting Signals of Nuclear Quadrupole Resonance*", Instrument and Experimental Techniques 41 398–400 (1998). A disadvantage of this system of coils is the low homogeneity of the distribution of the RF field along the radius of the spiral, with especially strong variations observed near the surfaces of each of the spirals.

In U.S. Pat. No. 5,457,385 (Sydney and Shaw) two arrays of parallel spaced apart coils are described, the coils being arranged into sets of opposed coil pairs with one coil of a set disposed in one array and the other coil of the same set disposed in the other array, opposite to each other. In addition to simple single annular coil arrangements, it is suggested to use a more complex coil arrangement for one of the coils to comprise a pair of square and flat spirally wound coils, electrically connected in parallel, and disposed in parallel juxtaposed relationship, instead of a single angular coil arrangement. Thus the resultant coil consists of two windings etched onto opposite sides of an insulating board each winding being in the shape of a flat band of constant width and being radially displaced to each other so that one winding is juxtaposed between the gap of the other winding. The width of the band and the gaps between the turns of the band are equal so that the resultant plane of the coil is continuously and alternately covered by the windings, except for a central rectangular region that is not occupied by either of the coils. The distance between the parallel planes of the windings, is provided by the thickness of the insulating board, and is so small that it can be assumed to be zero when studying the RF fields generated by the coil. The radial displacement of the turns of each winding corresponds to the width of the band, which serves to exclude variations in the RF field amplitude near to the coil windings. However, both windings are situated inside a region forming an annular belt, which circumscribes the central rectangular region that is devoid of coil windings. The disadvantage of such a system of coils is the fact that inside the volume circumscribed by this system, particularly near the surface of the spiral coils, the distribution of the RF field depends on the coordinates of the points, within which the amplitude of the RF field is determined in space. When moving from the external periphery of the coil to its centre close to its surface, the amplitude of the RF field first increases over the coil windings in the annular belt, and then drops sharply over the central rectangular region. Another disadvantage of this system is the necessity to use two windings for each of the spirals to exclude variations of the RF field amplitude near the turns of the coil in the annular belt.

The disadvantage of the coils suggested in patents U.S. Pat. No. 5,168,224 (Maruizumi et al) and U.S. Pat. No. 5,457,385 is that to create a sufficiently homogeneous RF field inside the scanned object, the geometrical dimensions of the coils must considerably exceed the geometrical dimensions of the scanned object. The use of such coils as compared with coils that have dimensions similar to the scanned objects, results in an increase in the RF power of the NQR spectrometer necessary to achieve the required RF field intensity, and results in a decreased filling factor of the coil and therefore a reduced sensitivity (to the NQR response).

DISCLOSURE OF THE INVENTION

The purpose of this invention is to increase the probability of detection of substances using the NQR method having regard to the design of the probe coil.

This probability may be increased by improving the homogeneity of the RF field within the volume circumscribed by the probe coil.

In the case of the present invention, this can be achieved by the utilisation of a coil system comprising a plurality of coil sections each having a spiral coil radially convolving outwardly from and about a centre point of the coil section.

Thus, in accordance with one aspect of the present invention, there is provided a coil assembly for a probe coil to be used in a system for detecting a nuclear quadrupole resonance signal in a substance, the coil assembly comprising a pair of opposed coil sections, each section consisting of a spiral coil arrangement having a spiral coil radially convolving outwardly from and about a centre point of the coil section.

Preferably, the spiral coil arrangement is configured in a saddle shape, the saddle shape having a central portion and a pair of coextending outer portions, the central portions of the sections being disposed in opposing spaced apart relationship about a common axis coincident with the centre points of each coil section, and the corresponding coextending outer portions of the sections being disposed in confronting opposed alignment with each other to circumscribe a scanned volume within which the substance is to be disposed.

Preferably, the winding of the coil is arranged so that the coil pitch varies along the radius of the coil.

Preferably, the coil winding has a transverse extent that varies along the radius to maintain a constant gap between the windings.

Preferably, the coil winding varies in accordance with a logarithmic winding scheme defined by the expression:

$$r_{n+1}/r_n = \ln(1+a(n+1))/\ln(1+an)$$

where n is the number of spiral turns, a is a parameter used for optimisation, $r_{n+1}$ and $r_n$ are distances from the centre of the spiral to the (n+1)-th and the n-th turns.

The invention will be better understood in the light of the following description of several embodiments of the best mode of the invention. The embodiments are described with reference to the accompanying drawings, which are briefly described below.

BEST MODE(S) FOR CARRYING OUT THE INVENTION

The best mode of the present invention is directed towards a probe coil for use in a system for detecting a nuclear quadrupole resonance (NQR) signal in response to irradiating a target substance disposed within a volume scanned with an RF field. The probe coil of the best mode results in an improvement of the homogeneity of the RF field used to irradiate the target substance within the scanned volume of the coil under the control of an NQR detector. The design of NQR detectors using probe coils for the purposes of detecting a NQR signal from an irradiated target substance are known in the art and will not be further described.

Figure 1:
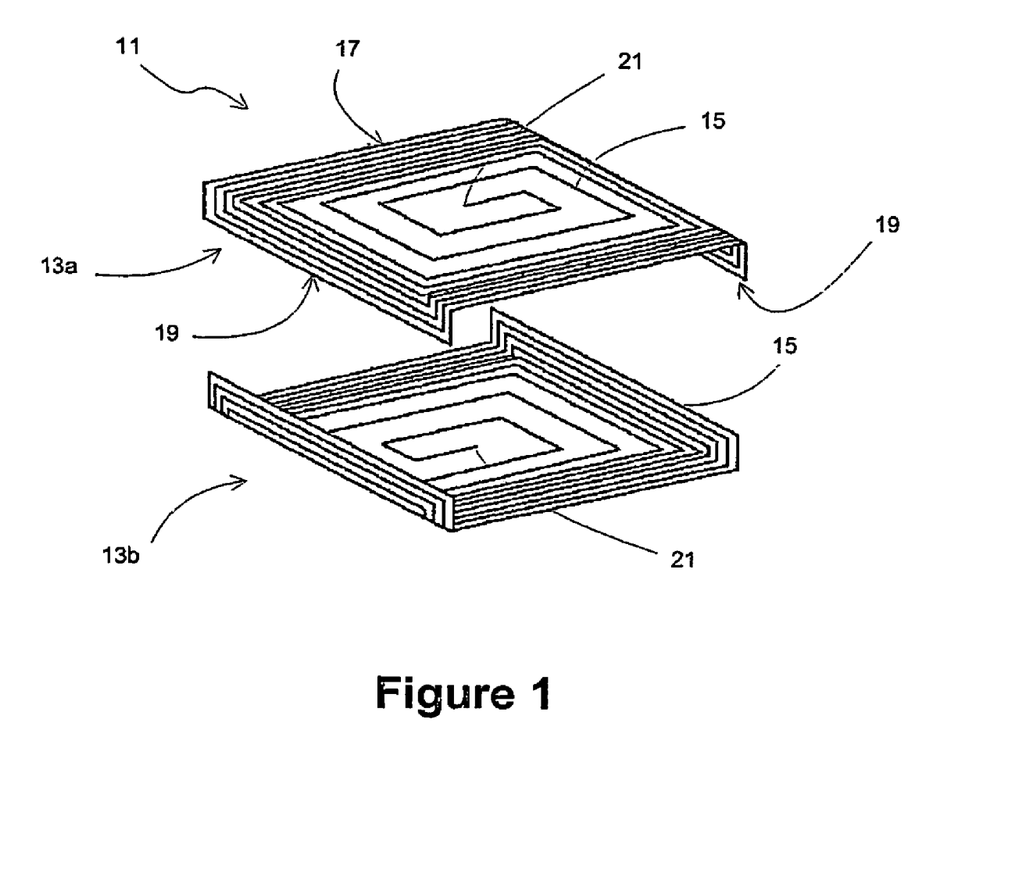
FIG. 1 shows a general view of the coil arrangement, which forms the subject of the present invention.

As shown in FIG. 1, the probe coil essentially includes a coil assembly 11 comprising two coil sections 13a and 13b. Each of the sections 13 consists of a combination of a spiral coil 15 having a variable coil pitch arranged in a saddle shape configuration. The saddle shape has a central portion 17 and a pair of outer coextending portions 19.

The coil sections 13 are located opposite each other with the central portions 17 of the respective sections disposed in parallel spaced apart relationship and the corresponding coextending portions 19 of the respective sections disposed in coplanar alignment with each other so that the sections combine to circumscribe a scanned volume within which the target substance is to be disposed.

The coil sections 13 have a mutual, common axis, which passes through the centre 21 of the central portions 17 of both sections, and about which the coils 15 of each section convolve. The coil sections are symmetrical about a fixed plane coincident with the common axis, whereby each central portion 17 is perpendicular to this plane and each coextending portion 19 is parallel thereto, thereby forming the saddle shape configuration.

Figure 1A:
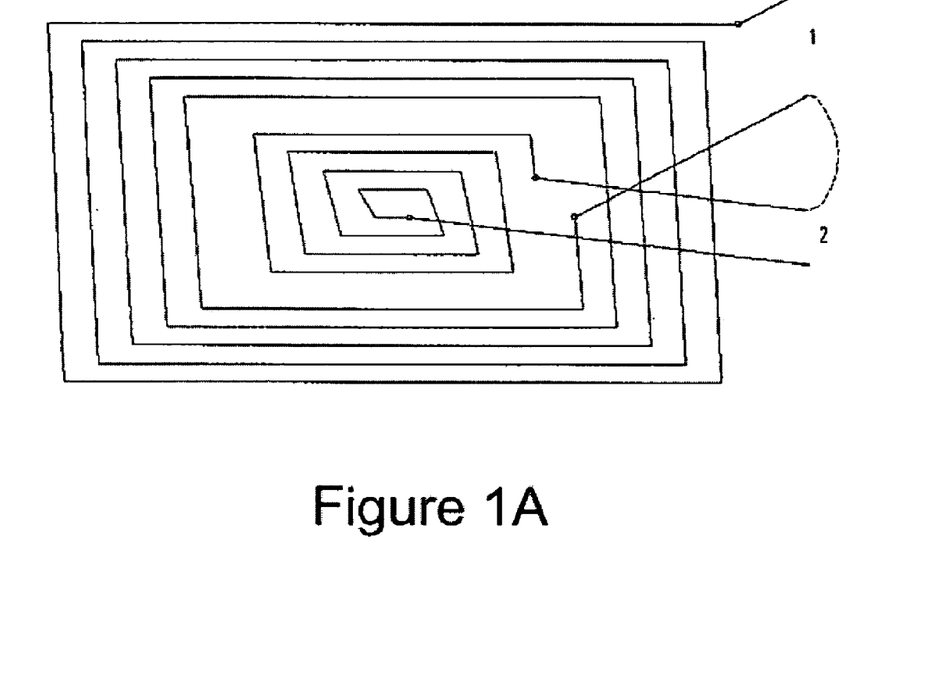
FIG. 1A is a schematic diagram showing a consequent or serial connection arrangement for the coil winding.
Figure 1B:
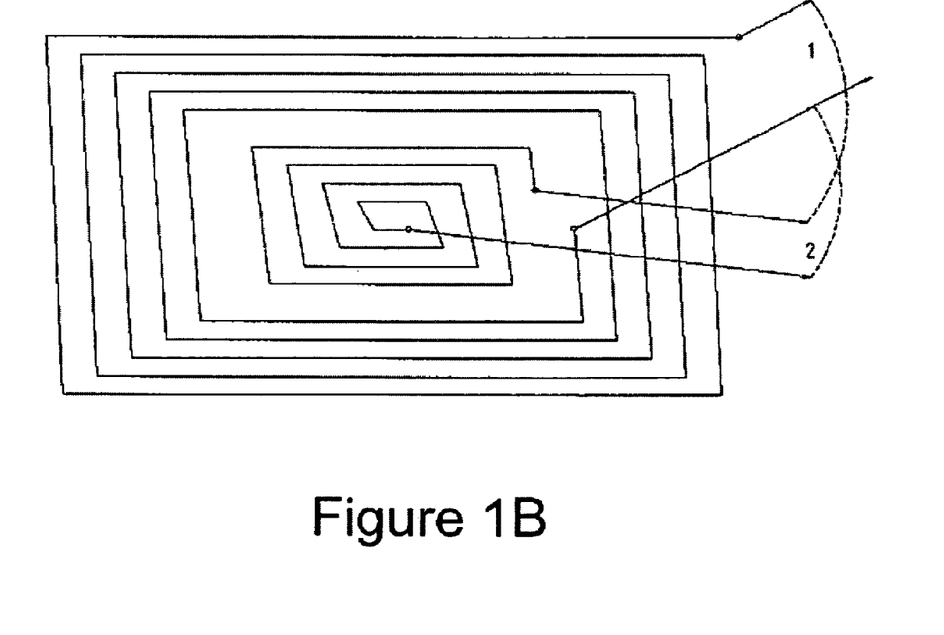
FIG. 1B is a schematic diagram showing a parallel connection arrangement for the coil winding.

Each coil section 13 can be divided into subsections. The electrical connection of the subsections may be either serial as shown in FIG. 1A or parallel as shown in FIG. 1B, or serial-parallel. By changing the number of the subsections and combining various types of electric connections of the subsections it is possible to obtain a very wide range of possible values of the coil inductance to allow for impedance matching.

The spiral coils 15 of each section 13 may be embodied with different cross-sectional shapes and in certain embodiments may dispense with outer coextending portions altogether and hence adopt an entirely planar configuration as opposed to the saddle shape configuration. Each of these embodiments will now be described in turn.

The first embodiment is directed towards a probe coil having a pair of parallel spaced apart coil sections to adopt the general coil assembly as shown in FIG. 1, but where a planar configuration is adopted as opposed to the saddle shape configuration by dispensing with the coextending flange portions.

Figure 2A:
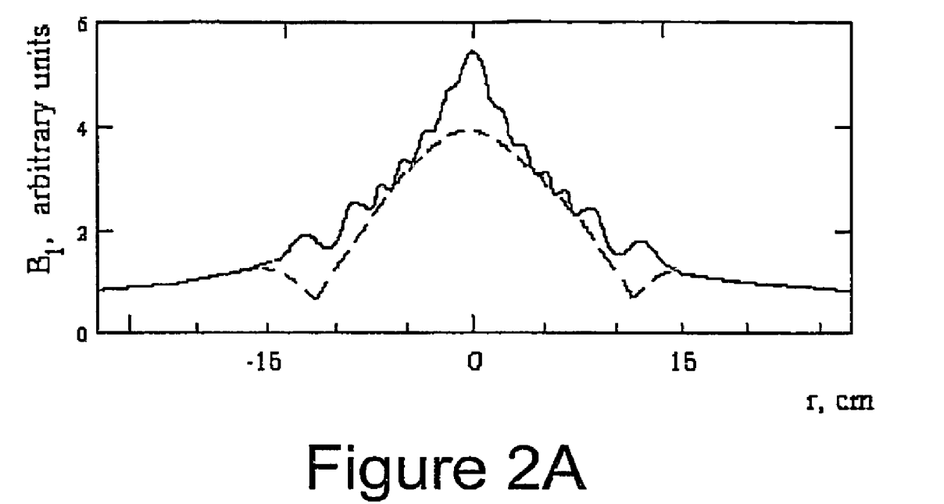
FIG. 2A, is a graph showing the distribution of the magnetic component of the RF field inside the specific coil arrangement shown in FIG. 2B.
Figure 2B:
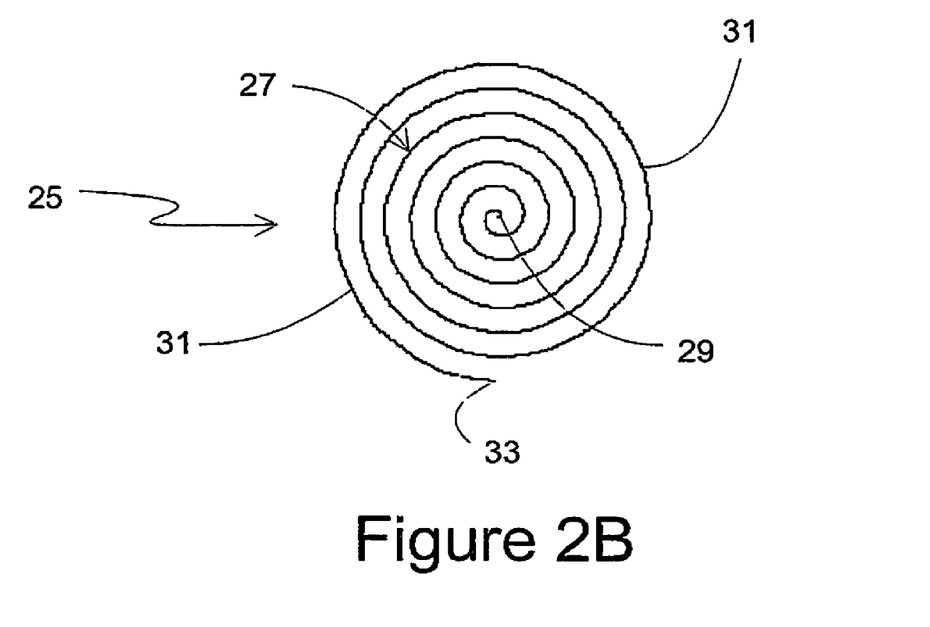
FIG. 2B is a plan view of one winding section of a coil arrangement similar to the arrangement shown in FIG. 1 using flat, annular spirals without the side flanges.

In this embodiment, as shown in FIG. 2B of the drawings, each coil section 25 comprises a circular spiral coil 27 having a planar surface.

The winding of each coil section 25 has a constant coil pitch and convolves radially outwardly from the centre 29 of the coil section towards the external edges of the section defined by the outermost winding 31 in an equi-spaced winding regime.

The coil winding 27 of each section 25 is made with a wire of conducting material that is of constant transverse extent, and thus the gaps between the turns of the coil winding are of a constant size.

FIG. 2A is a graph of the distribution of the magnetic component of the RF field inside the coils making up the probe coil assembly using the pair of coil sections 25, where the distance from the centre 29 of the spiral to the end 33 of the last turn 31 equals 11 cm, the distance between the surfaces of the coil section equals 10 cm, the number of turns of each coil winding equals 10, and the parameter used for optimisation a=0.25. The interrupted line in the graph corresponds to the distribution of the field at a height of 1 cm over the surface of one of the spirals and the uninterrupted line describes the total distribution of the field including the field in the middle of adjacent windings of the coil.

The second embodiment is similar to the first embodiment in that the probe coil has a pair of parallel spaced apart coil sections to provide the general coil assembly as shown in FIG. 1, but where each coil section comprises a square spiral coil instead of a round spiral coil.

Figure 3A:
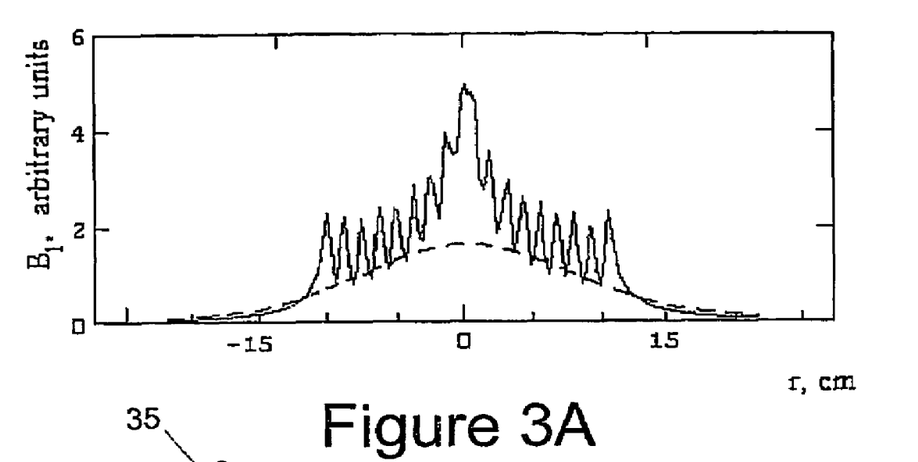
FIG. 3A is a graph showing the distribution of the magnetic component of the RF field inside the specific coil arrangement shown in FIG. 3B.
Figure 3B:
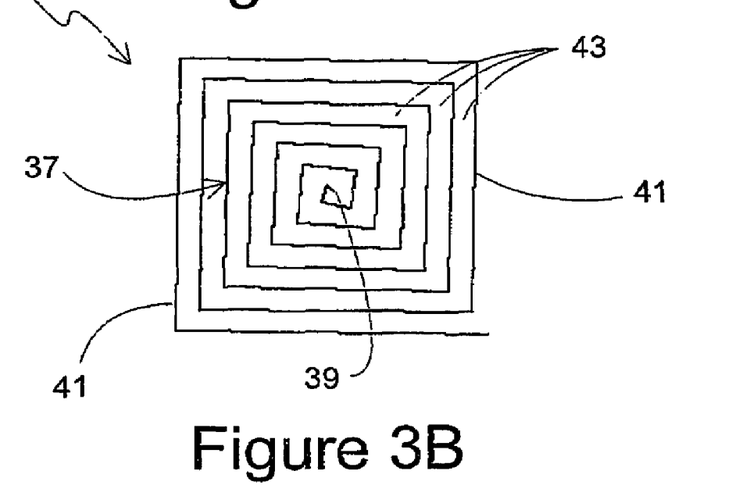
FIG. 3B is a plan view of a winding section similar to that of FIG. 2B, but using flat square spirals with an equi-spaced winding scheme.

As shown in FIG. 3B, the coil sections 35 of the second embodiment comprise a square spiral coil 37 having a planar surface.

The winding of each coil section 35 has a constant coil pitch and convolves radially outwardly from the centre 39 of the coil section towards the external edges of the section defined by the outermost winding 41 in an equi-spaced winding regime.

The coil winding 37 of each section 35 is made with a wire of conducting material that is of constant transverse extent, and thus the gaps 43 between the turns of the coil winding are of a constant size.

FIG. 3A is a graph of the distribution of the magnetic component of the RF field inside the coils making up the probe coil assembly using the pair of coil sections 35, where half the side of the outermost square winding 41 equals 11 cm, the distance between the surfaces of the opposing coil sections 35 equals 10 cm, the number of turns of each coil winding equals 10, and the parameter used for optimisation a=0.25.

The interrupted line in the graph corresponds to the distribution of the field at a height of 1 cm over the surface of one of the spirals and the uninterrupted line describes the total distribution of the field including the field in the middle of adjacent windings of the coil.

As can be seen from the graph, whilst this coil winding scheme shows a much greater variance in the magnetic field strength between windings than in the case of the circular spiral winding scheme, its magnitude is maintained to a much greater extent towards its outer periphery and thus overall provides a more homogeneous field than in the case of the previous embodiment.

The third embodiment is similar to the second embodiment in having a probe coil comprising a pair of parallel spaced apart coil sections to provide the general coil assembly as shown in FIG. 1, but where each coil section comprises a square spiral coil having a coil winding according to a logarithmic winding scheme instead of an equi-spaced winding scheme.

Figure 4A:
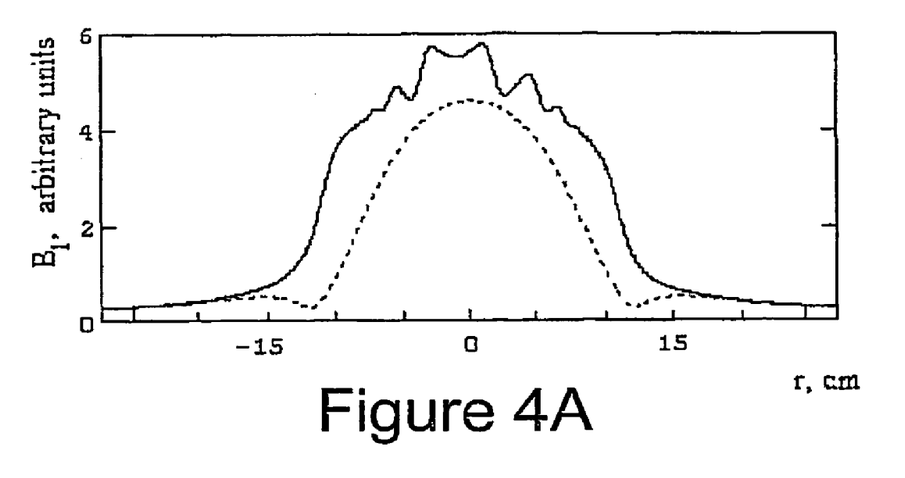
FIG. 4A is a graph showing the distribution of the magnetic component of the RF field inside the specific coil arrangement shown in FIG. 4B.
Figure 4B:
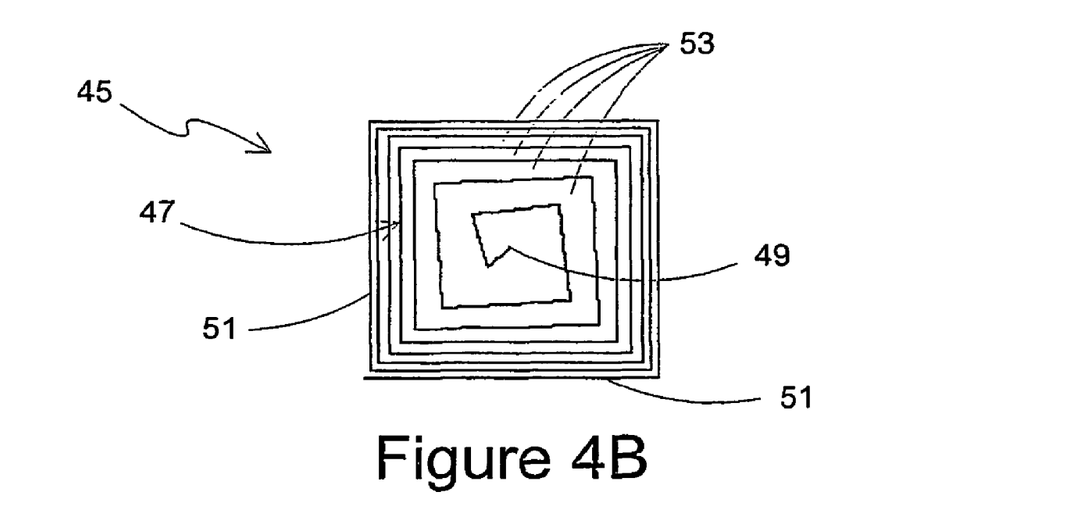
FIG. 4B is a plan view of a winding section similar to that of FIGS. 2B and 3B, but using flat square spirals with a logarithmic winding scheme.

As shown in FIG. 4B, the coil sections 45 of the third embodiment comprise a square spiral coil 47 having a flat, planar surface.

The winding of each coil section 45 has a variable coil pitch and convolves radially outwardly from the centre 49 of the coil section towards the external edges of the section defined by the outermost winding 51 in a logarithmic winding regime defined by the expression:

$$r_{n+1}/r_n = \ln(1+a(n+1))/\ln(1+an) \quad (1)$$

where n is the number of spiral turns, a is a parameter used for optimisation, $r_{n+1}$ and $r_n$ are distances from the centre of the spiral to the (n+1)-th and the n-th turns.

The coil winding 47 of each section 45 is made with a wire of conducting material that is of constant transverse extent, and so due to the logarithmic dependence of the coil winding, the gaps 53 between the turns of the coil winding are of variable size corresponding to the logarithmic expression (1).

FIG. 4A is a graph of the distribution of the magnetic component of the RF field inside the coils making up the probe coil assembly using the pair of coil sections 45 with the winding defined by the logarithmic expression (1), where half the side of the outermost square winding equals 11 cm, the distance between the surfaces of the opposing coil sections 45 equals 10 cm, the number of turns of each coil winding equals 10, and the optimisation parameter a=0.25.

The interrupted line in the graph corresponds to the distribution of the field at a height of 1 cm over the surface of one of the spirals and the uninterrupted line describes the total distribution of the field including the field in the middle of adjacent windings of the coil.

As can be seen from the graph, this coil winding scheme shows a marked improvement in the variance of the magnetic field strength between the windings than in both the case of the circular spiral winding and the regular square spiral winding schemes of the first and second embodiments. Furthermore, its magnitude is maintained and indeed is markedly improved from outer periphery of the coil across the intermediary windings to the middle of the coil. Thus overall the logarithmic square winding scheme provides a more homogeneous field than in the case of either of the previous embodiments.

The fourth embodiment is similar to the third embodiment in having a probe coil comprising a pair of parallel spaced apart coil sections having square coil windings wound according to the same logarithmic winding regime defined by the expression (1), but where a pair of opposing sides of each coil section are bent to adopt the saddle shape configuration as shown in FIG. 1 of the drawings.

Figure 5A:
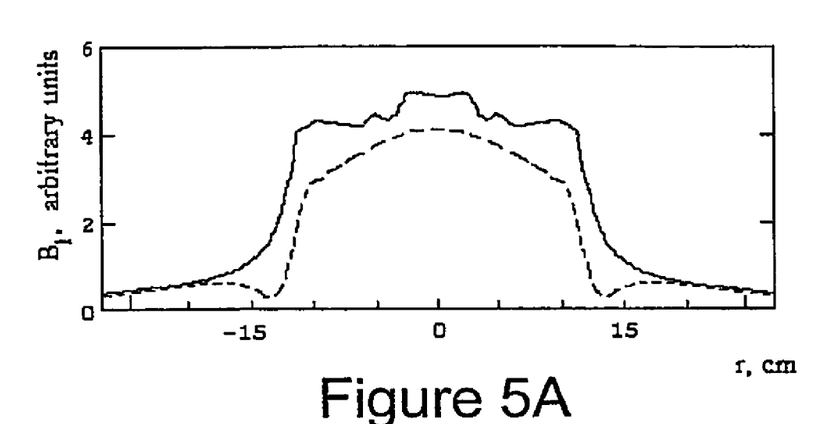
FIG. 5A is a graph showing the distribution of the magnetic component of the RF field inside the coil shown in FIG. 5B in accordance with the first embodiment, having parameters corresponding to those of the coil shown in FIG. 4B, where the winding is made of a flat band with variable width and shaped to adopt the saddle configuration shown in FIG. 1.
Figure 5B:
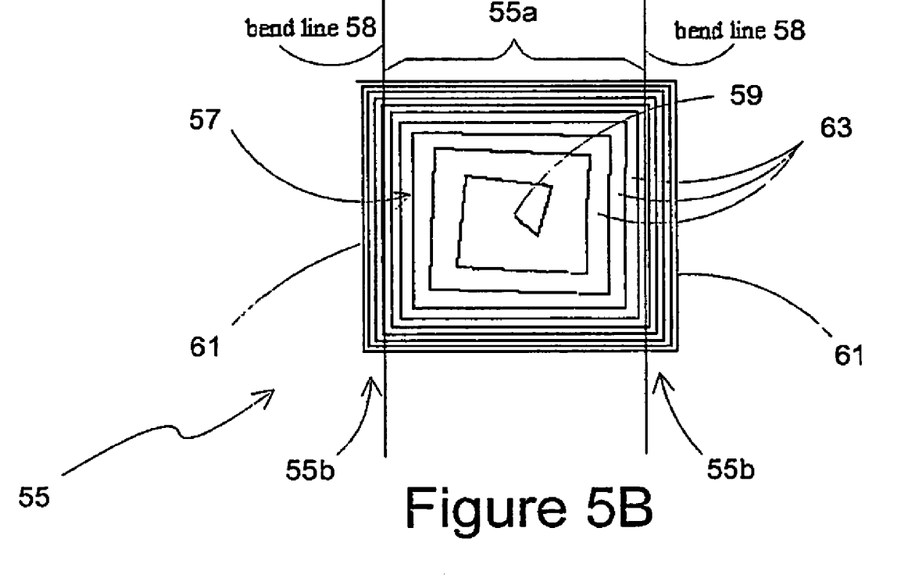
FIG. 5B is a plan view of the winding section in accordance with the first embodiment.

As shown in FIG. 5B, the coil sections 55 of the fourth embodiment comprise a square spiral coil 57 having a flat, planar surface, but which is bent along the bend lines 58 to form the saddle shape configuration as shown in FIG. 1. Thus the coil section 55 is divided into a web portion 55a and a pair of opposing coextending flange portions 55b.

The coil winding 57 of each coil section 55 has a variable coil pitch and convolves radially outwardly from the centre 59 of the coil section towards the external edges of the section defined by the outermost winding 61 in a logarithmic winding regime defined by the same expression (1), as in the third embodiment.

The coil winding 57 of each coil section 55 is made with a wire of conducting material that is of constant transverse extent, and so due to the logarithmic dependence of the coil winding, the gaps 63 between the turns of the coil winding are of variable size corresponding to the logarithmic expression (1).

FIG. 5A is a graph of the distribution of the magnetic component of the RF field inside the coils making up the probe coil assembly using the pair of coil sections 55 with the winding defined by the logarithmic expression (1), where half the side of the outermost square winding equals 11 cm, the distance between the surfaces of the opposing coil sections 35 equals 10 cm, the number of turns of each coil winding equals 10, and the optimisation parameter a=0.25.

The interrupted line in the graph corresponds to the distribution of the field at a height of 1 cm over the surface of one of the spirals and the uninterrupted line describes the total distribution of the field including the field in the middle of adjacent windings of the coil.

As can be seen from the graph, this coil winding scheme in the saddle shape configuration shows a further improvement in the variance of the magnetic field strength between the windings, particularly around the inner windings, than in the case of the logarithmic square spiral winding scheme without the saddle configuration of the third embodiment. Importantly, its magnitude is regular and constant at the outer periphery of the coil 57, right across the intermediary windings to the middle of the coil. Thus overall the saddle shape configuration improves the logarithmic square winding scheme to provide an even more homogeneous field than in the case of any of the previous embodiments.

The fifth embodiment is similar to the fourth embodiment in having a probe coil comprising a pair of parallel spaced apart coil sections having square coil windings wound according to the same logarithmic winding regime defined by the expression (1) and adopting the saddle shape configuration as shown in FIG. 1 of the drawings, but where the transverse extent of the coil is variable to maintain a constant sized gap between the coil windings as opposed to a variable gap.

Figure 6A:
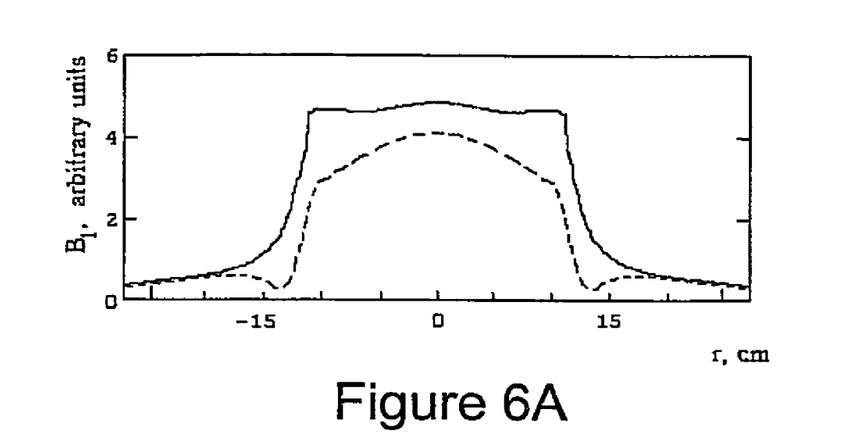
FIG. 6A is a graph showing the distribution of the magnetic component of the RF field inside the coil shown in FIG. 6B in accordance with the second embodiment.
Figure 6B:
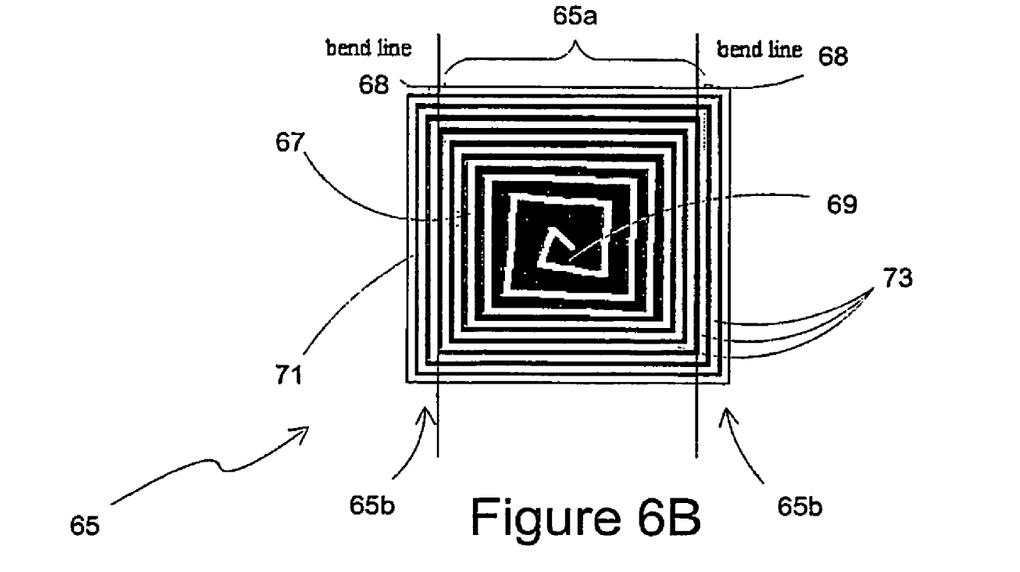
FIG. 6B is a plan view of the coil in accordance with the second embodiment.

As shown in FIG. 6B, the coil sections 65 of the fifth embodiment comprise a square spiral coil 67 having a flat, planar surface, but which is bent along the bend lines 68 to form the saddle shape configuration as shown in FIG. 1. Thus the coil section 65 is divided into a web portion 65a and a pair of opposing coextending flange portions 65b.

The coil winding 67 of each coil section 65 has a variable coil pitch and convolves radially outwardly from the centre 69 of the coil section towards the external edges of the section defined by the outermost winding 71 in a logarithmic winding regime defined by the same expression (1), as in the third embodiment.

The coil winding 67 of each section 65 is made with a wire of conducting material formed into the shape of a flat band that is of variable transverse extent, whereby the width of the band varies with the same regularity as the winding. In this manner, due to the logarithmic dependence of both the coil winding and the band width, the gaps 73 between the turns of the coil winding remain of a constant size.

The limits of the n-th turn of the band are defined by the expressions:

$$s_-(n) = \frac{r(n-1) + r(n)}{2} + \frac{h}{2} \quad (2)$$

and $$s_+(n) = \frac{r(n+1) + r(n)}{2} - \frac{h}{2},$$

with h being the distance between the limits of adjacent turns. In the present embodiment, h=5 mm.

FIG. 6A is a graph of the distribution of the magnetic component of the RF field inside the coils making up the probe coil assembly using the pair of coil sections 65 with the winding defined by the logarithmic expression (1), where half the side of the outermost square winding equals 11 cm, ie the entire side of each section equalling 22 cm, the distance between the surfaces of the opposing coil sections 65 equals 10 cm, the number of turns of each coil winding equals 10, and the optimisation parameter a=0.25. As previously mentioned, however, the coil winding is made up of flat band with a variable width, whereby the distance between the limits of adjacent turns of the winding is h=5 mm.

The interrupted line in the graph corresponds to the distribution of the field at a height of 1 cm over the surface of one of the spirals and the uninterrupted line describes the total distribution of the field including the field in the middle of adjacent windings of the coil.

As can be seen from the graph, this coil winding scheme with the saddle shape configuration, a coil winding defined by a logarithmic winding scheme and a coil comprising a flat band with a variable width corresponding with the winding scheme to provide a constant gap between the windings shows an even further improvement in the variance of the magnetic field strength between the windings. In particular, the magnitude of the magnetic field strength is highly regular and constant across the entire extent of the coil sections. Thus maintaining the coil winding with a constant gap 73 between the windings, together with the saddle shape configuration and adopting the logarithmic square winding scheme provides a very homogeneous field, superior to any of the previous embodiments.

Moreover, dividing up the internal volume of the coil V into volumes $v=l^3$, where l is the maximum distance between the adjacent turns of the coil, with $v<<V$, the use of the square spiral coil with the winding step conforming to the expression $r_{n+1}/r_n = \ln(1+a(n+1))/\ln(1+an)$, results in an increase of the homogeneity of the distribution of the average magnetic component of the RF field $\overline{B}$, averaged by volume v $$\overline{B} = \frac{1}{v} \int \int \int_v B(x-x_0, y-y_0, z-z_0) dx\, dy\, dz, \quad (3)$$

in the layer parallel to the spiral coil surfaces.

In this expression B (x,y,z) is the value of the magnetic component of the RF field in a point in space inside the coil with coordinates x, y, z; where $x_0$, $y_0$, $z_0$ are coordinates of the central point in the volume of integration v which determines its position inside the coil.

The use of the flat band winding with the varying band width depending on the variation of the coil pitch, smooths out the amplitude variations of the magnetic component of the RF field, which are particularly strong near the spiral's surface.

It should be appreciated that not only logarithmic, but any regularity which provides the convergence of the coil winding from the centre of the coil sections towards its edges ensures a better homogeneity of the magnetic field than the normal Archimedean spiral rule, according to which the coil pitch is constant.

Notwithstanding that several embodiments have been described herein, the invention is not limited to any of the specific embodiments and thus other coil combinations embracing some or all of the features in any one of the embodiments giving rise to an improvement or an advantage in the homogeneity of the RF field created by a probe coil in adopting the same, are considered to fall within the scope of the present invention. For example other embodiments may be envisaged adopting a convex coil winding configuration as opposed to the planar coil winding configurations described herein, or a hemispherical configuration. Furthermore, the wire need not be limited to a flat band and other embodiments can be envisaged where the wire is of a circular cross-section and variable diameter, decreasing in size from the centre to the outer extremities in a graduated manner.

The invention claimed is:

1. A coil assembly for a probe coil to be used in a system for detecting a nuclear quadrupole resonance signal in a substance, the coil assembly comprising a pair of opposed coil sections, each section consisting of a spiral coil arrangement having a spiral coil radially convolving outwardly from and about a centre point of the coil section, wherein the spiral coil arrangement is configured in a saddle shape, the saddle shape having a central portion and a pair of coextending outer portions. the central portions of the sections being disposed in opposing spaced apart relationship about a common axis coincident with the centre points of each coil section, and the corresponding coextending outer portions of the sections being disposed in confronting opposed alignment with each other to circumscribe a scanned volume within which the substance is to be disposed.

2. A coil assembly according to claim 1, wherein the winding of the coil is arranged so that the coil pitch varies along the radius of the coil.

3. A coil assembly according to claim 1, wherein the coil winding has a transverse extent that varies along the radius to maintain a constant gap between the windings.

4. A coil assembly according to claim 1, wherein the coil winding varies in accordance with a logarithmic winding scheme defined by the expression:

$$r_{n+1}/r_n = \ln(1+a(n+1))/\ln(1+an)$$

where n is the number of spiral turns, a is a parameter used for optimisation, $r_{n+1}$ and $r_n$ are distances from the centre of the spiral to the (n+1)-th and the n-th turns.

5. A coil assembly for a probe coil to be used in a system for detecting a nuclear quadrupole resonance signal in a substance, the coil assembly comprising a pair of opposed coil sections, each section consisting of a spiral coil arrangement having a spiral coil radially convolving outwardly from and about a centre point of the coil section, wherein the coil winding varies in accordance with a logarithmic winding scheme defined by the expression:

$$r_{n+1}/r_n = \ln(1+a(n+1))/\ln(1+an)$$

where n is the number of spiral turns, a is a parameter used for optimisation, $r_{n+}1$ and $r_n$ are distances from the centre of the spiral to the (n+1)-th and the n-th turns.

6. A coil assembly according to claim 5, wherein the winding of the coil is arranged so that the coil pitch varies along the radius of the coil.

7. A coil assembly according to claim 5, wherein the coil winding has a transverse extent that varies along the radius to maintain a constant gap between the windings.

* * * * *